United States Patent
Lin et al.

(10) Patent No.: US 8,976,533 B2
(45) Date of Patent: Mar. 10, 2015

(54) STORAGE DEVICE AND METHOD FOR PRODUCING THE SAME

(75) Inventors: Wei-Hung Lin, Hsinchu County (TW); Hung-I Chung, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 350 days.

(21) Appl. No.: 13/315,288

(22) Filed: Dec. 9, 2011

(65) Prior Publication Data

US 2013/0107440 A1 May 2, 2013

(30) Foreign Application Priority Data

Nov. 1, 2011 (TW) .............................. 100139851 A

(51) Int. Cl.
| | | |
|---|---|---|
| G06F 1/16 | (2006.01) | |
| H05K 3/30 | (2006.01) | |
| H05K 3/32 | (2006.01) | |
| H05K 1/11 | (2006.01) | |
| G11C 5/00 | (2006.01) | |
| H01L 25/00 | (2006.01) | |
| H05K 3/28 | (2006.01) | |
| H01R 12/72 | (2011.01) | |

(52) U.S. Cl.
CPC ........ G06F 1/16 (2013.01); H05K 1/117 (2013.01); G11C 5/00 (2013.01); H01L 25/00 (2013.01); H05K 3/284 (2013.01); H05K 2201/09063 (2013.01); H05K 2201/10159 (2013.01); H05K 2201/10189 (2013.01); H01R 12/725 (2013.01); H01L 2924/0002 (2013.01)
USPC ..................... 361/737; 361/736; 361/679.31

(58) Field of Classification Search
CPC .................. H05K 1/117; H05K 2201/10159; H05K 2201/10189; H05K 2201/09063; G06F 1/16

USPC ..................................... 361/679.31, 736, 737
See application file for complete search history.

(56) References Cited

U.S. PATENT DOCUMENTS

| | | | | |
|---|---|---|---|---|
| 2008/0218799 | A1* | 9/2008 | Hiew et al. ................... | 358/1.16 |
| 2011/0003493 | A1* | 1/2011 | Mo et al. ......................... | 439/81 |
| 2012/0020151 | A1* | 1/2012 | Lin et al. ....................... | 365/164 |
| 2012/0200996 | A1* | 8/2012 | Kuster ..................... | 361/679.31 |

FOREIGN PATENT DOCUMENTS

| | | |
|---|---|---|
| TW | M270551 | 7/2005 |
| TW | 201033814 | 9/2010 |

OTHER PUBLICATIONS

"Office Action of Taiwan Counterpart Application", issued on Dec. 3, 2014, p. 1-p. 11, in which the listed references were cited.

* cited by examiner

Primary Examiner — Jayprakash N Gandhi
Assistant Examiner — Mukund G Patel
(74) Attorney, Agent, or Firm — Jianq Chyun IP Office

(57) ABSTRACT

A storage device including a circuit board, an electronic device package and a terminal module is provided. The circuit board has a first surface and a second surface opposite to each other, a plurality of via-holes connecting the first surface and the second surface, a plurality of first pads on the first surface, and a plurality of first pads on the second surface. The electronic device package is disposed on the first surface. The terminal module disposed on the first surface has a plurality of first and second contact parts, and each of the first contact parts passes through the corresponding via-hole and is protruded out of the second surface, and each of the second contact parts is electrically connected to the corresponding first pad. An orthogonal projection area of the electronic device package on the first surface is smaller than an area of the first surface.

25 Claims, 4 Drawing Sheets

STORAGE DEVICE AND METHOD FOR PRODUCING THE SAME

CROSS-REFERENCE TO RELATED APPLICATION

This application claims the priority benefit of Taiwan application serial no. 100139851, filed on Nov. 1, 2011. The entirety of the above-mentioned patent application is hereby incorporated by reference herein and made a part of this specification.

BACKGROUND OF THE INVENTION

1. Field of the Invention

The invention relates to a storage device and a method for producing the same. Particularly, the invention relates to a storage device using a rewritable non-volatile memory as a storage medium, and a method for producing the same.

2. Description of Related Art

With development of multimedia technology, produced digital files become larger in size. Although a conventional 1.44 MB floppy disk is easy to carry, a capacity thereof is unable to meet current needs. Moreover, although a conventional disk-structure type hard disk can provide a large storage space, it is inconvenient to carry due to its large size. Since a rewritable non-volatile memory has features of data non-volatile, power saving, small size and none mechanical structure, etc., it is suitable for portable applications, and is most suitable for applying on battery-backed portable products. A flash drive is a storage device using a NAND flash memory as a storage medium.

Generally, the flash drive includes a circuit board, electronic elements, a plurality of elastic terminals and metal conductive sheets (which is also referred to as a connector or a connection interface) used for connecting a host. Although the size of the flash drive can be suitably reduced by miniaturizing the circuit board, limited by a size of a metal casing of the connector, it is hard to further miniaturize the flash drive. Therefore, how to further miniaturize the size of the flash drive is an important issue to be developed by related practitioners.

SUMMARY OF THE INVENTION

The invention is directed to a storage device and a method for producing the same, which is capable of effectively reducing a size of the storage device.

An exemplary embodiment of the invention provides a storage device including a circuit board, an electronic device package and a terminal module. The circuit board has a first surface and a second surface opposite to each other, a plurality of via-holes connecting the first surface and the second surface, a plurality of first metal pads on the first surface, and a plurality of second metal pads on the second surface. The electronic device package is disposed on the first surface. The terminal module is disposed on the first surface. The terminal module has a plurality of first contact parts and a plurality of second contact parts opposite to each other, where the first contact parts correspondingly pass through the via-holes and are protruded out of the second surface, and the second contact parts are electrically connected to the first metal pads. An orthogonal projection area of the electronic device package on the first surface is smaller than an area of the first surface.

An exemplary embodiment of the invention provides a method for producing a storage device, which is described as follows. A circuit board is configured, where the circuit board has a first surface and a second surface opposite to each other, a plurality of via-holes connecting the first surface and the second surface, and a plurality of first metal pads on the first surface. Then, a terminal module is electrically disposed on the first surface, where the terminal module has a plurality of first contact parts and a plurality of second contact parts opposite to each other, the first contact parts correspondingly pass through the via-holes and are protruded out of the second surface, and the second contact parts are electrically connected to the corresponding first metal pads. Finally, a molding compound is used to cover and package a control circuit device and a storage circuit device onto the first surface, and the molding compound leans against the terminal module in a stepping manner, or the molding compound and the terminal module are leaned against to each other with two opposite planes.

An exemplary embodiment of the invention provides a method for producing a storage device, which is described as follows. A molding compound is used to package a control circuit device and a storage circuit device to form an electronic device package. Then, a circuit board is configured, where the circuit board has a first surface and a second surface opposite to each other, a plurality of via-holes connecting the first surface and the second surface, and a plurality of first metal pads on the first surface. Then, the electronic device package is electrically disposed on the first surface. Finally, a terminal module is electrically disposed on the first surface, where the terminal module has a plurality of first contact parts and a plurality of second contact parts opposite to each other, the first contact parts correspondingly pass through the via-holes and are protruded out of the second surface, and the second contact parts are electrically connected to the first metal pads.

An exemplary embodiment of the invention provides a method for producing a storage device, which is described as follows. A circuit board is configured, where the circuit board has a first surface and a second surface opposite to each other, a plurality of via-holes connecting the first surface and the second surface, and a plurality of first metal pads on the first surface. Then, a molding compound is used to cover and package a control circuit device and a storage circuit device on the first surface. Finally, a terminal module is disposed on the first surface, where the terminal module and the molding compound are leaned against to each other. The terminal module has a plurality of first contact parts and a plurality of second contact parts opposite to each other, the first contact parts correspondingly pass through the via-holes and are protruded out of the second surface, and the second contact parts are electrically connected to the first metal pads.

Based on the above descriptions, according to the storage device and the method for producing the same of the invention, a size of the storage device can be effectively reduced.

It should be understood, however, that this Summary may not contain all of the aspects and embodiments of the present invention, is not meant to be limiting or restrictive in any manner, and that the present invention as disclosed herein is and will be understood by those of ordinary skill in the art to encompass obvious improvements and modifications thereto.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
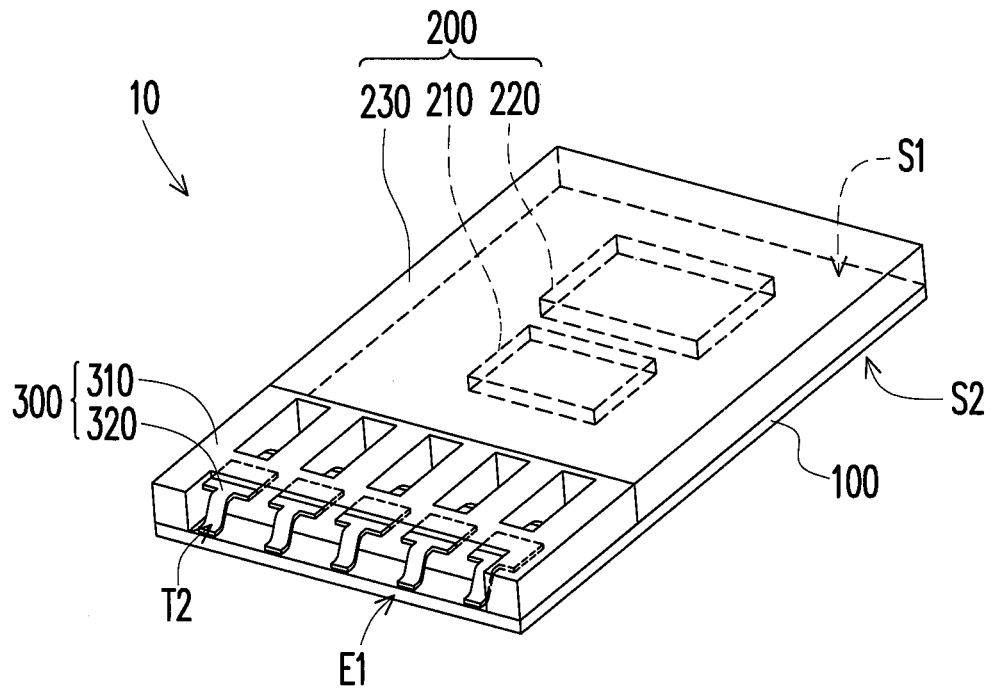
FIGS. 1A and 1B are schematic diagrams of a storage device viewed from opposite viewing angles according to an exemplary embodiment of the invention.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B, and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Figure 1B:
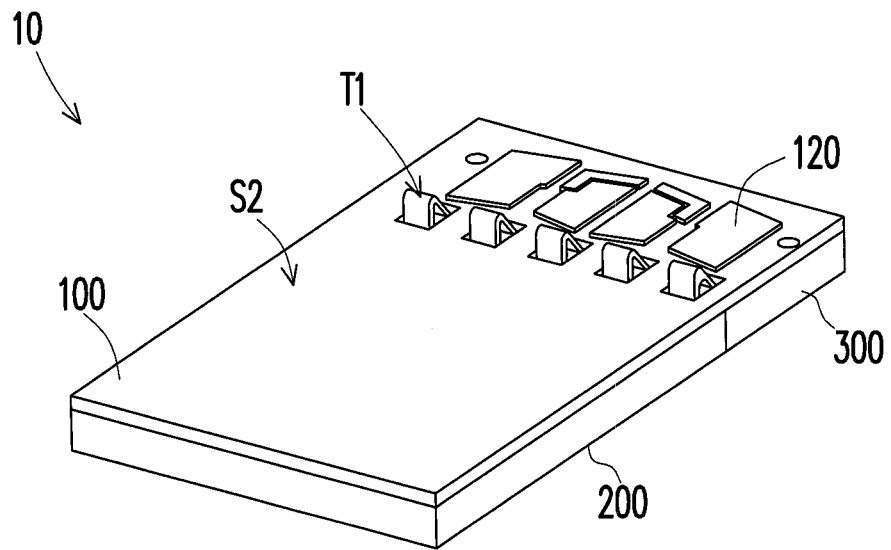
Figure 2A:
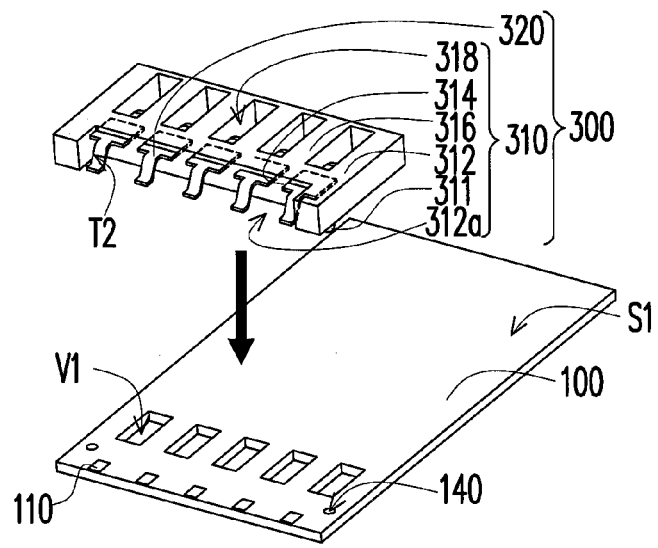
FIGS. 2A and 2B are assembling schematic diagrams of a part of components of the storage device of FIG. 1A.
Figure 2B:
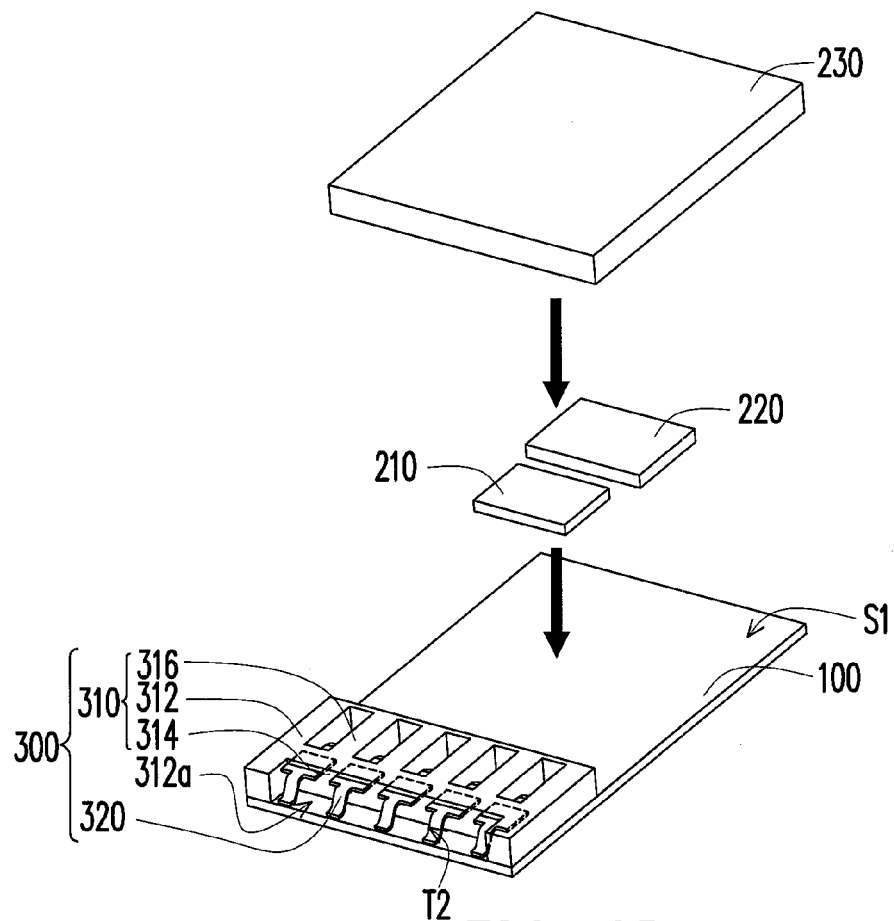

FIGS. 1A and 1B are schematic diagrams of a storage device viewed from opposite viewing angles according to an exemplary embodiment of the invention. FIGS. 2A and 2B are assembling schematic diagrams of a part of components of the storage device of FIG. 1A. Referring to FIGS. 1A and 1B and FIGS. 2A and 2B, in the present exemplary embodiment, the storage device 10 includes a circuit board 100, an electronic device package 200 and a terminal module 300. The circuit board 100 has a connection end E1, a first surface S1 and a second surface S2 opposite to each other, a plurality of via-holes V1 connecting the first surface S1 and the second surface S2, a plurality of first metal pads 110 on the first surface S1, and a plurality of second metal pads 120 on the second surface S2. The connection end E1 is connected to a connector of a host system (not shown). Namely, the storage device 10 faces to and is inserted to the host system through the connection end E1.

The electronic device package 200 and the terminal module 300 are electrically disposed on the first surface S1. The terminal module 300 has a plurality of first contact parts T1 and a plurality of second contact parts T2 opposite to each other. In a layout of the circuit board 100, the first metal pads 110 are disposed between the via-holes V1 and the connection end E1, and after the terminal module 300 is disposed on the first surface S1, the first contact parts T1 pass through the corresponding via-holes V1 and are protruded out of the second surface S2, and the second contact parts T2 are electrically connected to the first metal pads 110 respectively, and an arrangement of the second metal pads 120 on the second surface S2 and the first contact parts T1 protruded out of the second surface S2 are complied with a universal serial bus (USB) 3.0 standard.

According to the above descriptions, compared to the conventional technique, in the storage device 10 of the present embodiment, only the electronic device package 200 and the terminal module 300 are disposed on the circuit board 100, and the conventional metal casing is omitted, so that the size of the storage device 10 is effectively reduced.

In detail, the electronic device package 200 includes a control circuit device 210, a storage circuit device 220 and a molding compound 230. In the present exemplary embodiment, the control circuit device 210 is a main control circuit of the storage device 10. For example, the control circuit device 210 includes a micro processing unit, a buffer memory, a host interface module, a memory interface module, an error checking and correcting module and a power management module, etc. Moreover, the storage circuit device 220 is a rewritable non-volatile memory used for storing data. In the present exemplary embodiment, the storage circuit device 220 is a multi level cell (MLC) NAND flash memory circuit device. However, it should be noticed that the invention is not limited thereto, and in another exemplary embodiment of the invention, the storage circuit device 220 can also be a single level cell (SCL) NAND flash memory circuit device or other rewritable non-volatile memory circuit devices. Here, the control circuit device 210 and the storage circuit device 220 are packaged on the first surface S1 of the circuit board 100 by using the molding compound 230 according to a system in package (SIP) technique, and the control circuit device 210 and the storage circuit device 220 are electrically connected to each other through wires (not shown) on the circuit board 100.

Moreover, it should be noticed that an orthogonal projection area of the electronic device package 200 on the first surface S1 is smaller than an area of the first surface S1. In other words, in the present exemplary embodiment, a sum of the orthogonal projection area of the electronic device package 200 on the first surface S1 and an orthogonal projection area of the terminal module 300 on the first surface S1 is equal to the area of the first surface S1, i.e. the molding compound 230 only occupies a partial area of the first circuit S1 of the circuit board 100. Moreover, in the present embodiment, top surfaces of the electronic device package 200 and the terminal module 300 respectively disposed on the first surface S1 of the circuit board 100 are coplanar, though the invention is not limited thereto, and configuration of the electronic device package 200 and the terminal module 300 can be suitably modified according to a design requirement.

In the present exemplary embodiment, the electronic device package 200 and the terminal module 300 in the storage device 10 are independent components. In the conventional technique, the terminal module, the control circuit device and the storage circuit device are packed into one component, and when one of the components is malfunction, the other components are also scrapped, so that compared to the conventional technique, the present embodiment can effectively improve adaptability of the electronic device package 200 and the terminal module 300, and save fabrication cost thereof.

On the other hand, the terminal module 300 includes a fixing member 310 and a plurality of elastic terminals 320, where each of the elastic terminals 320 has the first contact part T1 and the second contact part T2, and the first contact part T1 and the second contact part T2 are all exposed out of the fixing member 310.

Further, the fixing member 310 includes a concave framework 312, a first beam 314 and a plurality of second beams 316. The concave framework 312 has an opening 312a, the first beam 314 is connected in the concave framework 312, and the second beams 316 are connected between the first beam 314 and the concave framework 312, where an extending direction of each of the second beams 316 faces to the opening 312a, so that the first beam 314 and the second beams 316 form a plurality of pores 318 in the concave framework 312, i.e. the first beam 314 and the second beams 316 are disposed in the concave framework 312 and are perpendicular to each other. In other words, the fixing member 310 substantially has a grid-like profile, and when it is assembled to the circuit board 100, the pores 318 and the via-holes V1 are aligned to each other, so that the first contact parts T1 can sequentially pass through the pores 318 and the via-holes V1 to protrude out from the second surface S2 of the circuit board 100.

The elastic terminals 320 are substantially embedded in the first beam 314, where the second contact parts T2 extend towards the opening 312a, and the first contact parts T1 are in the corresponding pores 318. In the present exemplary embodiment, each of the elastic terminals 320 has a bending profile that is formed by bending a metal material, and the first contact parts T1 are located at inflexion points of the bending profiles, so that when the storage device 10 is connected to the host system, a better contact effect is achieved through elasticity of the bended elastic terminals 320.

Referring to FIG. 2A and FIG. 2B, which illustrate a fabrication process of the storage device 10. In FIG. 2A, the terminal module 300 is first disposed on the first surface S1 of the circuit board 100 according to a surface mounting technique (SMT), where the circuit board 100 has positioning holes 140, and the fixing member 310 of the terminal module 300 has corresponding positioning poles 311, so as to position the circuit board 100 and the terminal module 300 in a disposing process. Moreover, the invention is not limited thereto, and a designer can design a positioning structure other than the positioning holes according to an existing technique to achieve the mutual positioning effect of the terminal module 300 and the circuit board 100. In FIG. 2B, the molding compound 230 is used to package the control circuit device 210, the storage circuit device 220 onto the first surface S1, and the molding compound 230 and the fixing member 310 are leaned against to each other with two opposite planes to complete producing the storage device 10.

Figure 3A:
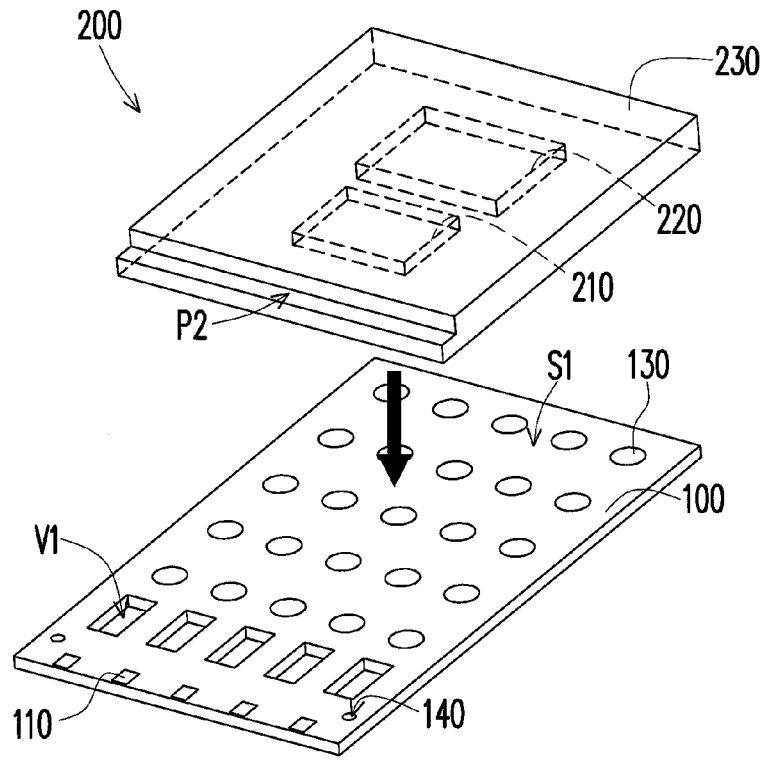
FIGS. 3A and 3B are schematic diagrams illustrating a flow of producing a storage device according to another exemplary embodiment of the invention.
Figure 3B:
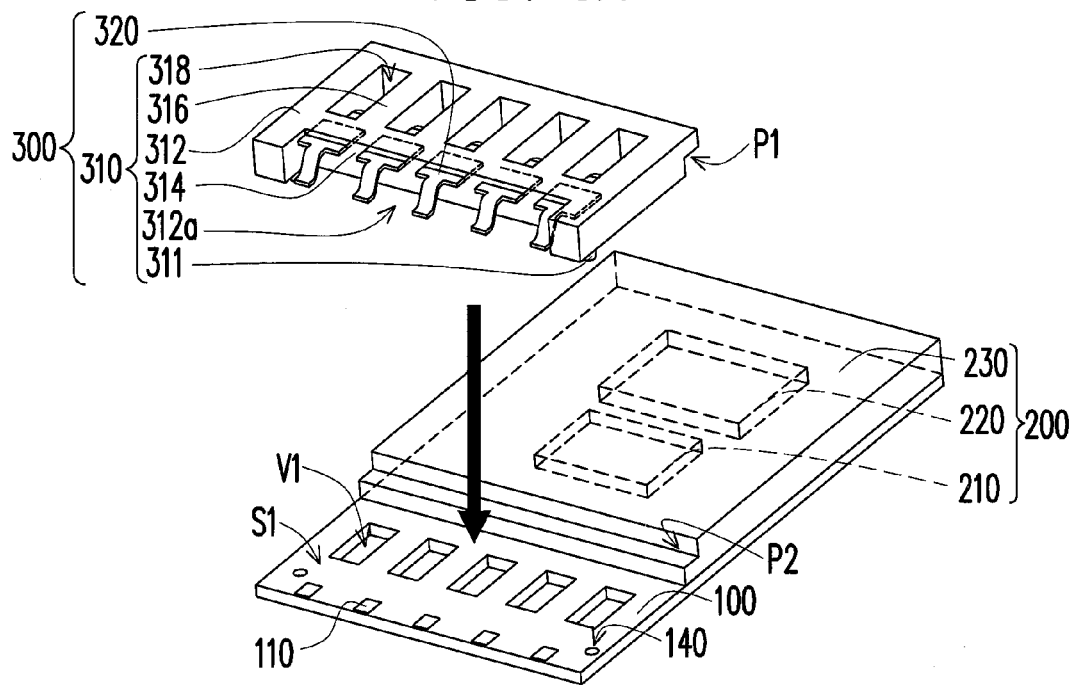

The flow of producing the storage device 10 is not limited by the invention, and FIGS. 3A and 3B are schematic diagrams illustrating a flow of producing the storage device according to another exemplary embodiment of the invention. Referring to FIG. 3A and FIG. 3B, the control circuit device 210 and the storage circuit device 220 are first packaged through the molding compound 230 to form an electronic device package 200, which is, for example, a chip package structure of a ball grid array (BGA) in the present exemplary embodiment. Moreover, the circuit board 100 further has a plurality of third metal pads 130, and when the electronic device package 200 is disposed on the first surface S1 of the circuit board 100, solder balls (not shown) on the bottom of the electronic device package 200 are electrically connected to the third metal pads 130. Finally, the terminal module 300 is disposed on the first surface S1 through the SMT. Here, the fixing member 310 and the molding compound 230 respectively have lips P1 and P2 overlapped to each other, so that the terminal structure 300 can provide a fixing effect to the electronic device package 200 through such step leaning structure.

Figure 4A:
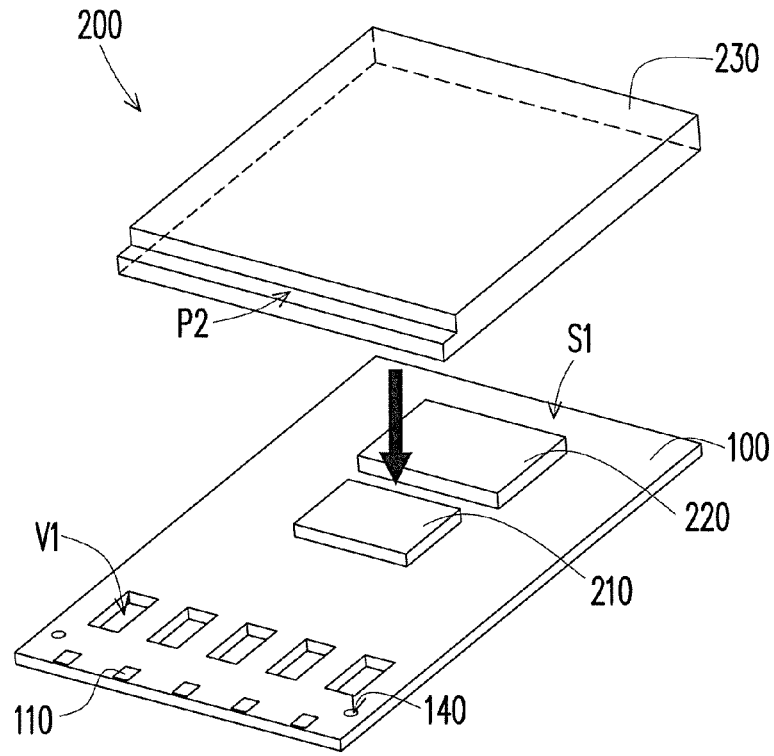
FIGS. 4A and 4B are schematic diagrams illustrating a flow of producing a storage device according to still another exemplary embodiment of the invention.
Figure 4B:
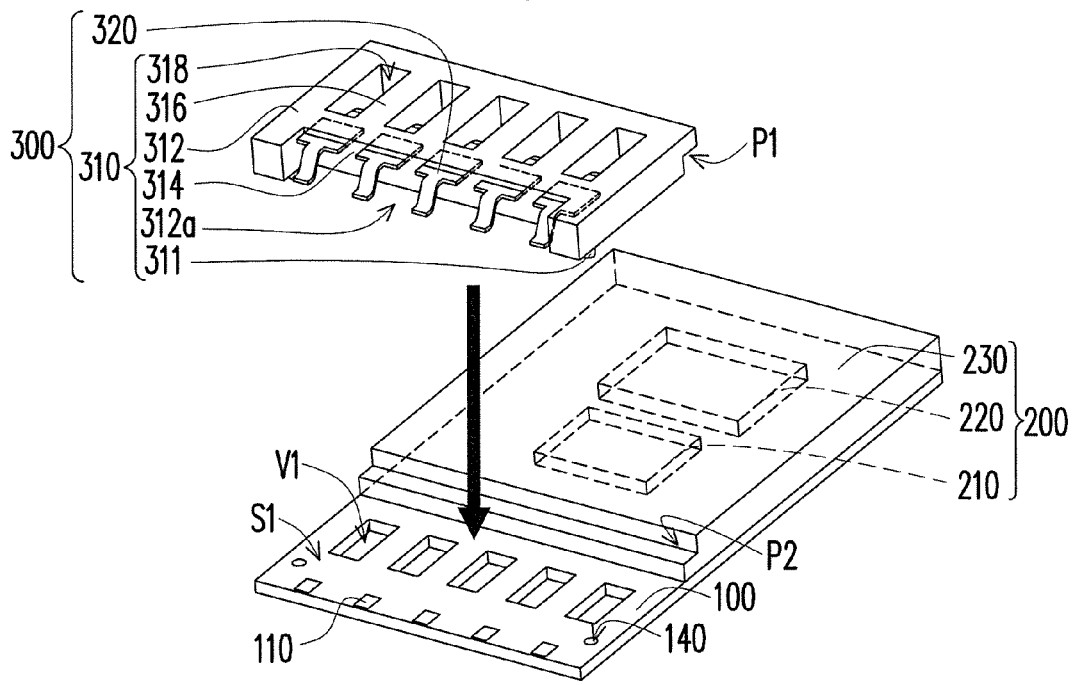

Moreover, a configuration relationship of the terminal module and the electronic device package configured on the first surface is not limited by the invention. FIGS. 4A and 4B are schematic diagrams illustrating a flow of producing the storage device according to still another exemplary embodiment of the invention. Referring to FIG. 4A and FIG. 4B, under a premise that a sum of the orthogonal projection area of the electronic device package 200 on the first surface S1 and the orthogonal projection area of the terminal module 300 on the first surface S1 is smaller than or equal to the area of the first surface S1, a length of the electronic device package 200 and a length of the terminal module 300 can be suitably varied according to a design requirement, i.e. the electronic device package 200 and the terminal module 300 can be partially overlapped in structure. Further, opposite to the embodiment of FIG. 2A and FIG. 2B, in the present exemplary embodiment, the molding compound 230 is first used to package the control circuit device 210 and the storage circuit device 220 on the first surface S1. Then, the terminal module 300 is disposed on the first surface S1, and the orthogonal projection of the electronic device package 200 on the first surface S1 is partially overlapped to the orthogonal projection of the terminal module 300 on the first surface S1, and meanwhile as the lips P1 and P2 of the electronic device package 200 and the terminal module 300 are overlapped to each other, such that a structure strength of the packaged structure is enhanced.

In summary, in the exemplary embodiments of the invention, the electronic device package and the terminal module are respectively independent components of the storage device, and based on relative configuration relationships of the two components, besides adaptability of the storage device is improved and fabrication cost thereof is reduced, the size of the storage device is also effectively reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A storage device, comprising:
 a circuit board, having a first surface and a second surface opposite to each other, a connection end and another end opposite to each other, a plurality of via-holes connecting the first surface and the second surface, a plurality of first metal pads on the first surface and disposed between the via-holes and the connection end, and a plurality of second metal pads on the second surface;
 an electronic device package, disposed on the first surface; wherein the electronic device package comprises:
 a control circuit device, electrically connected on the first surface;
 a storage circuit device, electrically connected on the first surface and electrically connected to the control circuit device; and
 a molding compound, covering and packaging the control circuit device and the storage circuit device onto the first surface of the circuit board, wherein the molding compound is located between the via-holes and the another end of the circuit board and the via-holes are uncovered by the molding compound.

2. The storage device as claimed in claim 1, further comprising:
 a terminal module, disposed on the first surface, located between the molding compound and the connection end, and having a plurality of first contact parts and a plurality of second contact parts opposite to each other, wherein the first contact parts correspondingly pass through the via-holes and are protruded out of the second surface, and the second contact parts are electrically connected to the first metal pads.

3. The storage device as claimed in claim 2, wherein the terminal module comprises:
a fixing member, disposed on the first surface and leaning against the molding compound; and
a plurality of elastic terminals, embedded in the fixing member, and having the first contact parts and the second contact parts, wherein the first contact parts and the second contact parts are all exposed out of the fixing member.

4. The storage device as claimed in claim 3, wherein an orthogonal projection of the molding compound on the first surface is partially overlapped to an orthogonal projection of the fixing member on the first surface.

5. The storage device as claimed in claim 3, wherein each of the elastic terminals has a bending profile, and the first contact parts are located at inflexion points of the bending profiles.

6. The storage device as claimed in claim 3, wherein the circuit board has a positioning hole, the fixing member has a positioning pole, and the positioning pole is inserted in the positioning hole to position the fixing member on the first surface.

7. The storage device as claimed in claim 3, wherein the fixing member comprises:
a concave framework, having an opening;
a first beam, connected in the concave framework; and
a plurality of second beams, wherein each of the second beams is connected between the first beam and the concave framework, and an extending direction of each of the second beams faces to the opening to form a plurality of pores in the concave framework.

8. The storage device as claimed in claim 7, wherein each of the elastic terminals is embedded in the first beam, the second contact parts extend towards the opening, and the first contact parts are in the corresponding pores.

9. The storage device as claimed in claim 2, wherein a sum of the orthogonal projection area of the electronic device package on the first surface and an orthogonal projection area of the terminal module on the first surface is smaller than or equal to the area of the first surface.

10. The storage device as claimed in claim 1, wherein the circuit board has a plurality of third metal pads, and the electronic device package is electrically connected to the third metal pads.

11. The storage device as claimed in claim 1, wherein an arrangement of the second metal pads and the first contact parts are complied with a universal serial bus (USB) 3.0 standard.

12. The storage device as claimed in claim 1, wherein the first metal pads and the second metal pads are located on a same end of the circuit board and back to each other.

13. The storage device as claimed in claim 1, wherein the first metal pads are disposed between the via-holes and a connection end of the circuit board.

14. The storage device as claimed in claim 1, wherein top surfaces of the electronic device package and the terminal module are coplanar.

15. The storage device of claim 1, wherein the molding compound uncovers a portion of the circuit board between the via-holes and the connection end of the circuit board.

16. A method for producing a storage device, comprising:
configuring a circuit board, wherein the circuit board has a first surface and a second surface opposite to each other, a plurality of via-holes connecting the first surface and the second surface, and a plurality of first metal pads on the first surface;

after configuring the circuit board, electrically connecting a terminal module on the first surface, wherein the terminal module has a plurality of first contact parts and a plurality of second contact parts opposite to each other, the first contact parts correspondingly pass through the via-holes and are protruded out of the second surface, and the second contact parts are electrically connected to the corresponding first metal pads; and after electrically connecting the terminal module on the first surface, using a molding compound to cover and package a control circuit device and a storage circuit device onto the first surface, wherein an orthogonal projection area of the molding compound on the first surface is smaller than an area of the first surface.

17. The method for producing the storage device as claimed in claim 16, wherein the molding compound leans against the terminal module in a stepping manner, or the molding compound and the terminal module are leaned against to each other with two opposite planes.

18. The method for producing the storage device as claimed in claim 16, wherein a sum of an orthogonal projection area of the molding compound on the first surface and an orthogonal projection area of the terminal module on the first surface is equal to an area of the first surface.

19. A method for producing a storage device, comprising:
using a molding compound to package a control circuit device and a storage circuit device to form an electronic device package;

after using the molding compound to package the control circuit device and the storage circuit device, configuring a circuit board, wherein the circuit board has a first surface and a second surface opposite to each other, a plurality of via-holes connecting the first surface and the second surface, and a plurality of first metal pads on the first surface;

after configuring the circuit board, electrically connecting the electronic device package on the first surface; and after electrically connecting the electronic device package on the first surface, electrically connecting a terminal module on the first surface, wherein the terminal module has a plurality of first contact parts and a plurality of second contact parts opposite to each other, the first contact parts correspondingly pass through the via-holes and are protruded out of the second surface, and the second contact parts are electrically connected to the first metal pads.

20. The method for producing the storage device as claimed in claim 19, wherein an orthogonal projection area of the molding compound on the first surface is smaller than an area of the first surface.

21. The method for producing the storage device as claimed in claim 19, wherein a sum of an orthogonal projection area of the molding compound on the first surface and an orthogonal projection area of the terminal module on the first surface is smaller than or equal to an area of the first surface.

22. The method for producing the storage device as claimed in claim 19, wherein the electronic device package is a ball grid array package structure.

23. A method for producing a storage device, comprising:
configuring a circuit board, wherein the circuit board has a first surface and a second surface opposite to each other, a plurality of via-holes connecting the first surface and the second surface, and a plurality of first metal pads on the first surface;

after configuring the circuit board, using a molding compound to cover and package a control circuit device and a storage circuit device onto the first surface; and after using the molding compound to cover and package the control circuit device and the storage circuit device onto the first surface, disposing a terminal module on the first surface, wherein the terminal module has a plurality of first contact parts and a plurality of second contact parts opposite to each other, the first contact parts correspondingly pass through the via-holes and are protruded out of the second surface, and the second contact parts are electrically connected to the first metal pads.

24. The method for producing the storage device as claimed in claim 23, wherein a sum of an orthogonal projection area of the molding compound on the first surface and an orthogonal projection area of the terminal module on the first surface is smaller than or equal to an area of the first surface.

25. The method for producing the storage device as claimed in claim 23, wherein the terminal module leans against the molding compound in a stepping manner, or the molding compound and the terminal module are leaned against to each other with two opposite planes.

* * * * *